(12) United States Patent
Pan (10) Patent No.: US 11,367,786 B1
(45) Date of Patent: Jun. 21, 2022

(54) BACK-GATED QUANTUM WELL HETEROSTRUCTURE

(71) Applicant: HRL Laboratories, LLC, Malibu, CA (US)

(72) Inventor: Andrew S. Pan, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 59 days.

(21) Appl. No.: 17/080,752

(22) Filed: Oct. 26, 2020

Related U.S. Application Data (60) Provisional application No. 63/007,467, filed on Apr. 9, 2020.

(51) Int. Cl.
*H01L 29/775* (2006.01)
*H01L 29/66* (2006.01)
*H01L 29/12* (2006.01)

(52) U.S. Cl.
CPC .......... *H01L 29/775* (2013.01); *H01L 29/122* (2013.01); *H01L 29/66439* (2013.01)

(58) Field of Classification Search
CPC combination set(s) only.
See application file for complete search history.

(56) References Cited

U.S. PATENT DOCUMENTS

2016/0204202 A1* 7/2016 Jain .................... H01L 29/7881
136/255

OTHER PUBLICATIONS

Emeleus, C. J. et al., "Back gating of a two-dimensional hole gas in a SiGe quantum well", Applied Physics Letters, Apr. 7, 1997, pp. 1870-1872, vol. 70, No. 14, American Institute of Physics.

Ismail, K. et al., "Gated Hall effect measurements in high-mobility n-type Si/SiGe modulation-doped heterostructures", Applied Physics Letters, Feb. 13, 1995, pp. 842-844, vol. 66, No. 7, American Institute of Physics.

Slinker, K. A. et al., "Quantum dots in Si/SiGe 2DEGs with Schottky top-gated leads", New Journal of Physics, Nov. 29, 2005, pp. 1-8, Institute of Physics Publishing Ltd and Deutsche Physikalische Gesellschaft.

* cited by examiner

*Primary Examiner* — Julio J Maldonado
*Assistant Examiner* — Mohammad A Rahman
(74) *Attorney, Agent, or Firm* — Lewis Roca Rothgerber Christie (57) ABSTRACT

A semiconductor device. In some embodiments, the semiconductor device includes a back gate layer; a buffer layer, on the back gate layer; a device quantum well layer, on the buffer layer; a cap layer, on the device quantum well layer; a top layer, on the cap layer; a first doped region of a first conductivity type, extending at least part-way through the device quantum well layer; a second doped region, of a second conductivity type, within the buffer layer; and a third doped region, of the second conductivity type extending from the top layer to the second doped region. The top layer may include a dielectric layer, and, in the dielectric layer, a plurality of conductive elements, including one or more dot gates, an ohmic contact, a bath gate, a supply gate, and a halo contact.

20 Claims, 6 Drawing Sheets

BACK-GATED QUANTUM WELL HETEROSTRUCTURE

CROSS-REFERENCE TO RELATED APPLICATION(S)

The present application claims priority to and the benefit of U.S. Provisional Application No. 63/007,467, filed Apr. 9, 2020, entitled "DESIGNS FOR BACK-GATED QUANTUM WELL HETEROSTRUCTURES", the entire content of which is incorporated herein by reference.

GOVERNMENT LICENSE RIGHTS

This invention was made with Government support. The Government has certain rights in this invention.

FIELD

One or more aspects of embodiments according to the present disclosure relate to semiconductor devices, and more particularly to back-gated quantum well heterostructures.

BACKGROUND

Some heterostructure designs for quantum computation applications cannot allow the achievable vertical field to exceed the threshold for surface accumulation under the supply gate, which may limit the achievable vertical field to be less than 1 mV/nm to 2 mV/nm. At this vertical field, the performance of such a device may be limited, for example, by relatively poor valley splitting.

Thus, there is a need for a device allowing larger vertical fields (e.g., of order 5 mV/nm to 10 mV/nm) for increasing the valley splitting or other relevant quantum dot properties.

SUMMARY

A semiconductor device design is described that enables back gating of heterostructures with a larger dynamic range of allowable electric fields without inducing leakage during cryogenic operation. A forward-biased "halo" p-n junction is utilized to prevent leakage and unwanted accumulation in the ohmic and supply gate regions, respectively. This allows the vertical electric field and hence the wave functions of electrons in the heterostructure to be tuned over a wide range, which may be advantageous for manipulating valley splitting and other fundamental device properties.

According to an embodiment of the present invention, there is provided a semiconductor device, including: a back gate layer; a buffer layer, on the back gate layer; a device quantum well layer, on the buffer layer; a cap layer, on the device quantum well layer; a top layer, on the cap layer; a first doped region of a first conductivity type, extending at least part-way through the device quantum well layer; a second doped region, of a second conductivity type, within the buffer layer; and a third doped region, of the second conductivity type extending from the top layer to the second doped region, the top layer including: a dielectric layer, and, in the dielectric layer, a plurality of conductive elements, including: one or more dot gates; an ohmic contact; a bath gate, between the one or more dot gates and the ohmic contact; a supply gate between the bath gate and the ohmic contact; and a halo contact, the third doped region extending from the halo contact to the second doped region, the second doped region extending under the ohmic contact and under the supply gate.

In some embodiments, the cap layer is undoped under the supply gate, under the bath gate, and under the one or more dot gates.

In some embodiments, the buffer layer is undoped under the bath gate and under the one or more dot gates.

In some embodiments, the second doped region has a dopant concentration sufficiently great to avoid freeze-out of carriers at temperatures less than 5 K.

In some embodiments, the second doped region has a peak dopant concentration of at least $10^{18}/cm^3$.

In some embodiments, the second doped region has a vertical full width half maximum of at least 30 nm.

In some embodiments, the first doped region has a peak dopant concentration of at least $10^{19}/cm^3$.

In some embodiments, the third doped region has a peak dopant concentration of at least $10^{19}/cm^3$.

In some embodiments, the first conductivity type is n-type and the second conductivity type is p-type.

In some embodiments, the semiconductor device further includes a back gate quantum well, on the back gate layer;

In some embodiments, the semiconductor device further includes a fourth doped region of the first conductivity type within the buffer layer, the fourth doped region being under the second doped region and having at least the same lateral extent as the second doped region.

In some embodiments, the first doped region extends to the fourth doped region.

In some embodiments, the fourth doped region has a dopant concentration sufficiently great to avoid freeze-out of carriers at temperatures less than 5 K.

In some embodiments, the cap layer is undoped under the supply gate, under the bath gate, and under the one or more dot gates.

In some embodiments, the buffer layer is undoped under the bath gate and under the one or more dot gates.

In some embodiments, the second doped region has a dopant concentration sufficiently great to avoid freeze-out of carriers at temperatures less than 5 K.

In some embodiments, the second doped region has a peak dopant concentration of at least $10^{18}/cm^3$.

In some embodiments, the second doped region has a vertical full width half maximum of at least 30 nm.

In some embodiments, the first doped region has a peak dopant concentration of at least $10^{19}/cm^3$.

In some embodiments, the third doped region has a peak dopant concentration of at least $10^{19}/cm^3$.

BRIEF DESCRIPTION OF THE DRAWINGS

These and other features and advantages of the present disclosure will be appreciated and understood with reference to the specification, claims, and appended drawings wherein:

DETAILED DESCRIPTION

The detailed description set forth below in connection with the appended drawings is intended as a description of exemplary embodiments of a back-gated quantum well heterostructure provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1A:
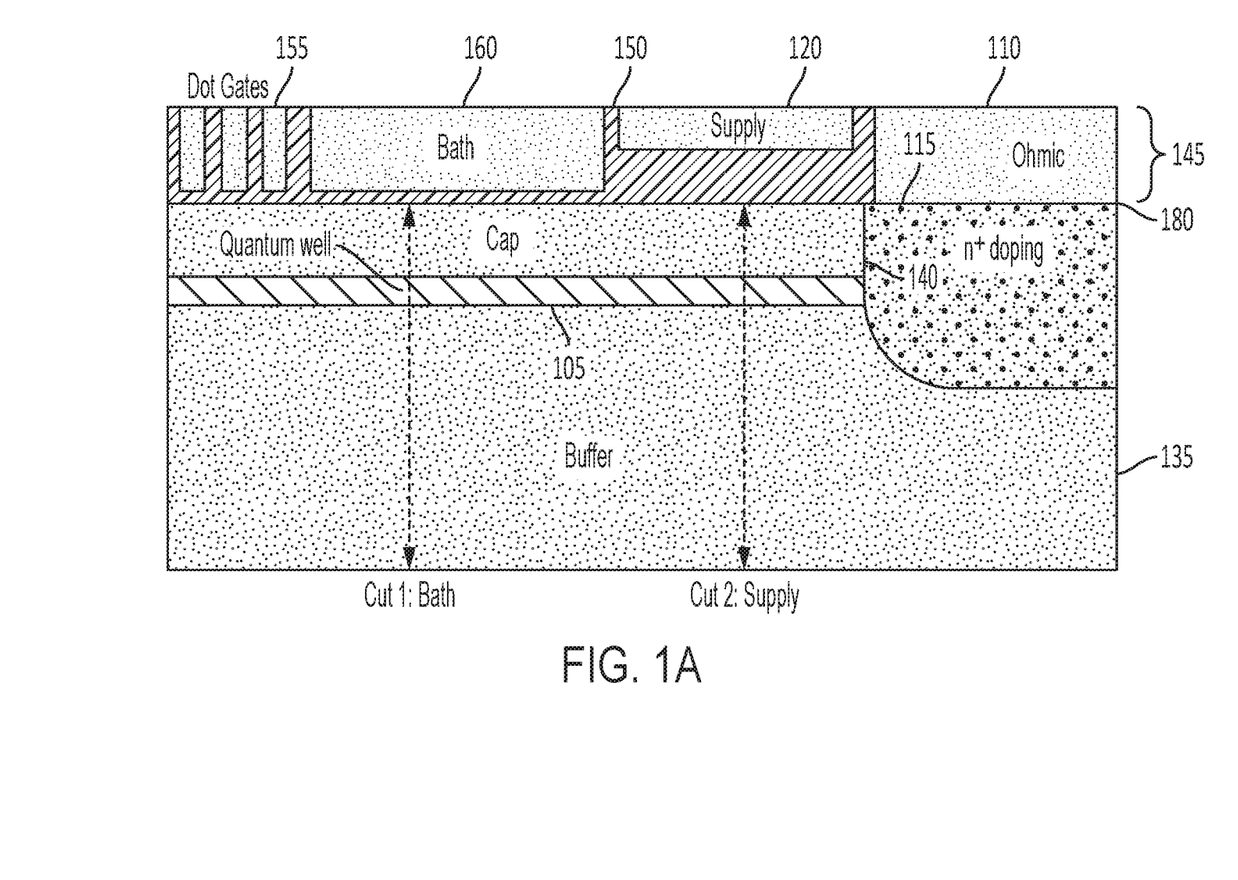
FIG. 1A is a schematic drawing of aspects of a device design for heterostructures, according to an embodiment of the present disclosure.

FIG. 1A is a schematic drawing (not drawn to scale), of aspects of a device design for heterostructures for operation at cryogenic temperatures. The device includes a buffer layer 135 (which may be composed of silicon germanium (SiGe)), a quantum well 105 ((QW) or "device quantum well") (which may be composed of silicon) on the buffer layer 135, a cap layer 140 (which may be composed of SiGe) on the device quantum well 105, and a top layer 145 on the cap layer 140. The top layer 145 may be composed of a dielectric layer 150 (which include, e.g., consist of, an oxide material), and, embedded in the dielectric layer, a plurality of conductive elements, including one or more dot gates 155, one or more ohmic contacts 110, a bath gate 160, a supply gate 120, and (shown in FIGS. 2 and 3) a halo contact 175. The bath gate 160 may be between the one or more dot gates 155 and the one or more ohmic contacts 110, and the supply gate 120 may be between the bath gate and the one or more ohmic contacts 110. In some embodiments, an interfacial layer 180 (e.g., a layer of silicon, illustrated in FIGS. 1A, 2, and 3 as subsumed in the black line between the cap layer 140 and the top layer 145) is between the cap layer 140 and the top layer 145.

Some SiGe heterostructure designs, such as that shown in FIG. 1A, do not have a back gate design or simply have a grounded substrate. In devices with a back gate, biasing of the back gate can induce leakage currents from the substrate to the contact (ohmic) regions. Furthermore, such heterostructure device designs require a supply gate region where the vertical electric field is low to prevent surface accumulation channel formation. Since biasing the substrate will apply a uniform vertical electric field throughout the device, including the supply gate region, this limits the achievable range of vertical fields.

In part for this reason, an objective of some embodiments is to block the back gate to ohmic leakage path and decouple the vertical field in the supply gate region from that in the active area of the device (encompassing the gated bath and electrostatic quantum dot areas of the device) by introducing a forward biased p-n junction underneath the ohmic and supply gate areas of the device. The p-n junction screens the ohmic and supply gate areas from the back gate bias and allows independent control of the supply gate vertical field.

In some embodiments an additional buried n-well region can also be deployed to block hole leakage paths. This may substantially increase the dynamic range of achievable vertical electric field in the active region of SiGe heterostructure designs. The presence of the back gate also provides a well-defined ground plane and allows for dynamic tuning of the device threshold voltage, which can be useful for controlling the operating voltage range of the device.

Figure 1B:
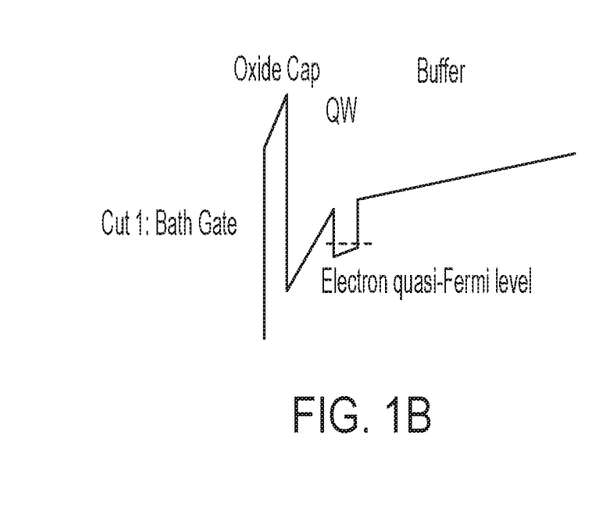
FIG. 1B is a band diagram along the line Cut 1 of FIG. 1A, below the bath gate, according to an embodiment of the present disclosure.
Figure 1C:
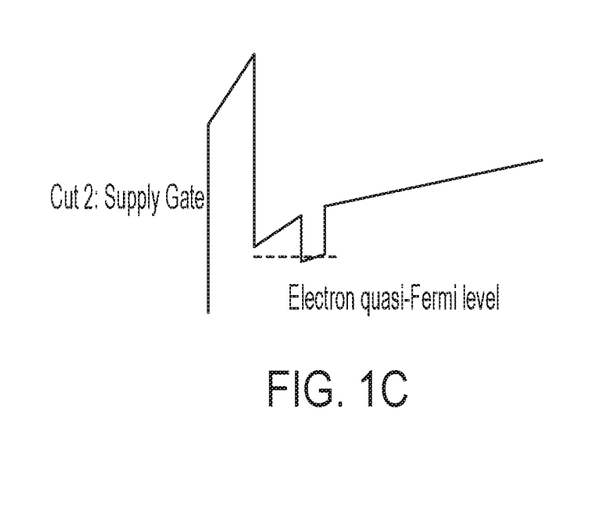
FIG. 1C is a band diagram along the line Cut 2 of FIG. 1A, below the supply gate, according to an embodiment of the present disclosure.

FIG. 1B and FIG. 1C are band diagrams along the lines Cut 1 (below the bath gate) and Cut 2 (below the supply gate), of FIG. 1A, respectively. The band diagrams for the supply and bath gates are very different; the bath gate may be biased to a nonequilibrium condition beyond the metal oxide semiconductor (MOS) accumulation point, whereas the supply gate may not.

Some embodiments are directed to a design for heterostructures to enable independent control over vertical electric fields in different lateral regions of the quantum well. Such embodiments allow a high vertical electric field to be induced in the active region of the device without inducing undesirable leakage pathways elsewhere in the heterostructure. In some embodiments, a $Si_{0.7}Ge_{0.3}$-sSi conduction electron quantum well structure is used; the general features of designs disclosed herein are applicable to other quantum well designs utilizing different heterostacks or carrier types. Independent control of the vertical electric field in these devices is desirable because it allows additional control of the vertical confining potential and hence the quantum dot wave function, which can alter the valley splitting, magnetic dephasing rate, and other relevant properties. In some embodiments, desirable vertical fields in SiGe—Si quantum wells are of the order of 1 mV/nm to 10 mV/nm. Typical SiGe cap thicknesses are of the order of 60 nm. The vertical field in the quantum dot region can be modified by the voltages applied to the dot gates; however, due to the geometry of these gates the field modulation is relatively weak and spatially nonuniform in the plane of the quantum dot. Furthermore, many other properties of the quantum dot are sensitive to the precise voltage configuration of the dot gates, so that independent control of the vertical fields is difficult to achieve.

One alternative is to construct a back gate which can be biased to exert a uniform vertical electric field. This can be done in many ways; for instance, a heavily doped substrate and/or buffer region can be used, which can be contacted and biased. However, such designs induce a uniform electric field throughout the whole heterostructure, including under the baths and supply gate regions. In particular, a strong vertical field can induce MOS accumulation in the supply gate and hence throughout the device. Therefore, a method is needed to allow a back gate to induce sufficient vertical field without leading to MOS accumulation.

As mentioned above, an example of a heterostructure design for quantum dots is illustrated in FIG. 1A. Supplying electrons to the active device (where the quantum dots reside) requires baths where a 2-D electron gas (2DEG) can be induced in the device quantum well 105 by biasing appropriate bath gates. These electrons are ultimately supplied from ohmic contacts 110 induced by a contacted n+-doping region 115 (which may be referred to as the "ohmic region" or simply the "ohmic"), which also defines the electron quasi-Fermi level in the semiconductor. Therefore, when the bath gate voltage is applied to induce a 2DEG in the quantum well, under thermal equilibrium another 2DEG can form at the metal-oxide-semiconductor (MOS) interface 180 if the bias exceeds the MOS threshold voltage such that the potential at the interface becomes lower than the Fermi level. This may be fatal for device control since it may lead to quantum dot formation in the MOS accumulation region in addition to the quantum well. To prevent this, an additional supply gate 120 may be placed between the ohmic region and the bath; this supply gate 120 can be biased at a lower bias such that a low but finite 2DEG density is induced therein to provide electrical contact between the bath and the ohmic region, while the potential at the supply gate MOS interface remains high enough to prevent electron accumulation. In the absence of a direct connection to the ohmic region, the bath voltage can be increased to beyond the equilibrium MOS threshold voltage without inducing a surface 2DEG. The ohmic region 115 may, in operation, supply carriers (e.g., electrons) to the device quantum well 105, and, as such, the ohmic region 115 may extend at least part-way through the device quantum well 105 (e.g., it may extend all the way through the device quantum well 105 and into the buffer layer 135).

Figure 2:
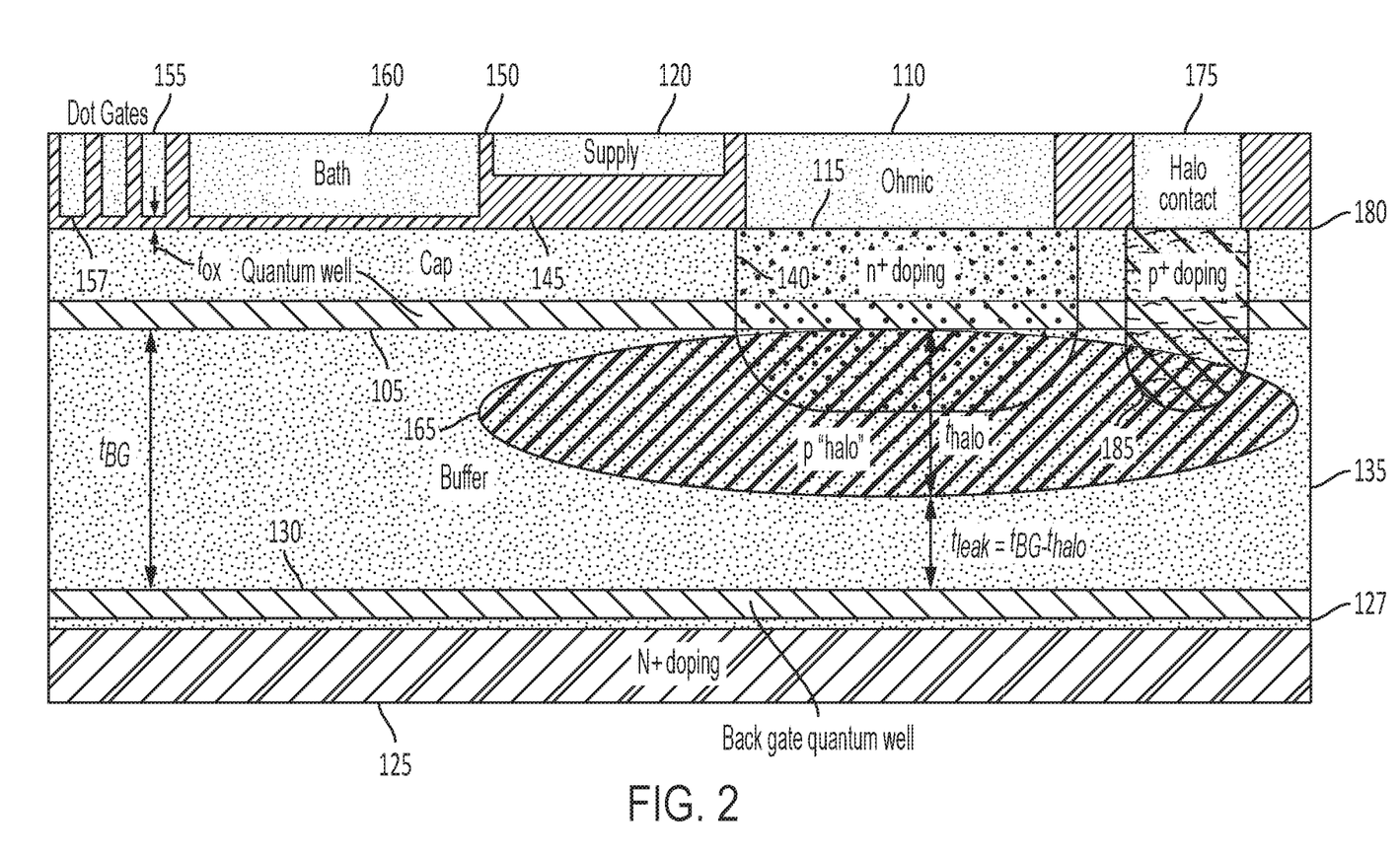
FIG. 2 is a schematic drawing of aspects of a device design for heterostructures, according to an embodiment of the present disclosure.

Furthermore, if the substrate is biased as a back gate, current can leak between the ohmic and substrate due to the applied voltage between them. This can be blocked using a potential barrier between the ohmic and the substrate. Referring to FIG. 2, one method to achieve this is to place an oppositely doped "halo" 165 (or "halo region", which may be referred to as a "second doped region") underneath the ohmic region (which may be referred to as a "first doped region"), similar to the formation of halo doping junctions for leakage short channel leakage suppression in short channel MOS field-effect transistors (MOSFETs). However, the large built-in voltage from the p-n junction induces a very high electric field in the supply gate region, which can induce MOS accumulation.

Figure 3:
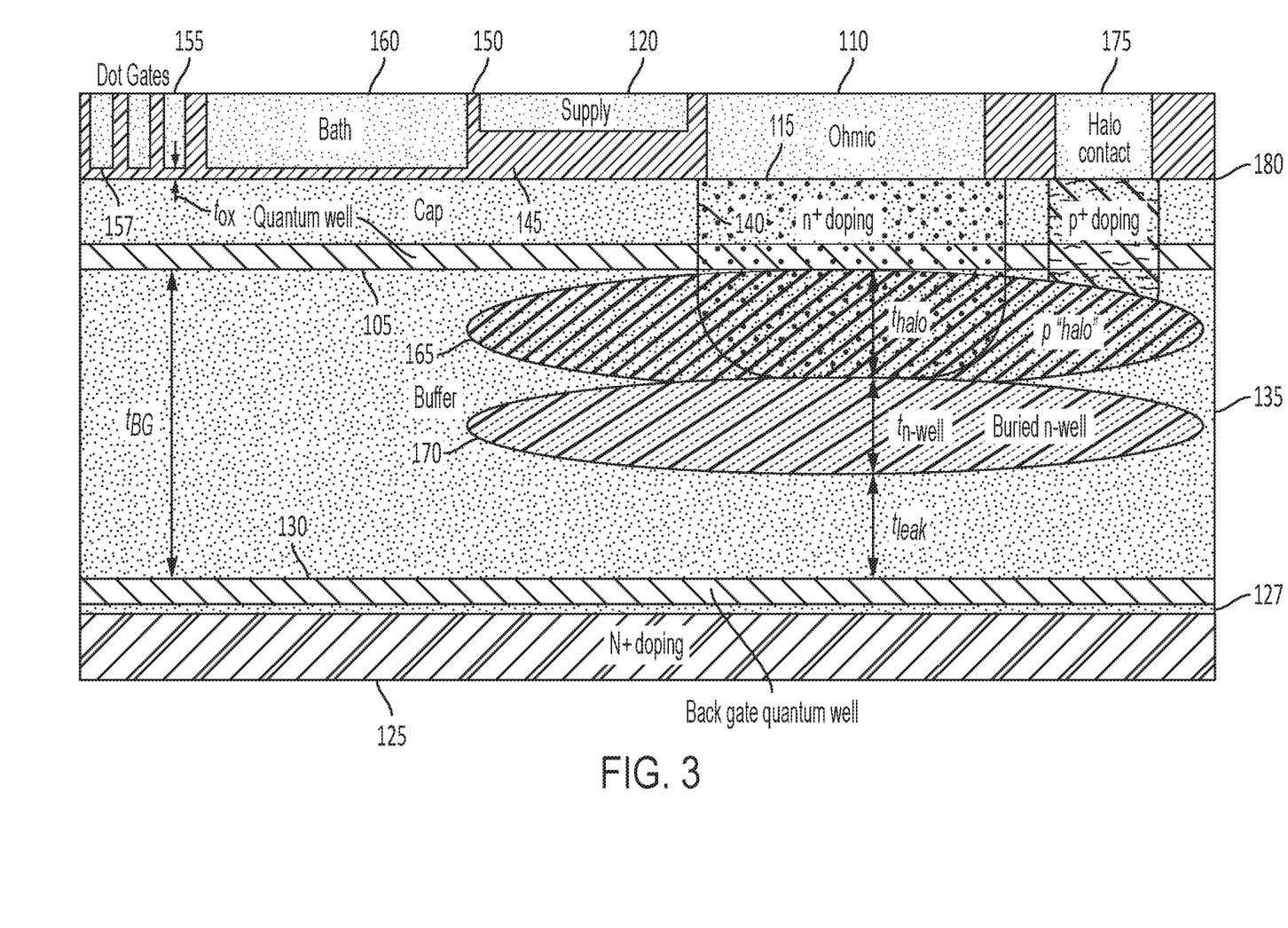
FIG. 3 is a schematic drawing of aspects of a device design for heterostructures, according to an embodiment of the present disclosure.

One embodiment solves this difficulty by utilizing a biased p-n junction to screen the supply gate region from the back gate 125. This allows independent control via the junction bias of the vertical field under the supply gate and hence allows accumulation in the QW 105 and depletion at the MOS interface, while the back gate bias produces a separate electric field elsewhere in the device. A schematic of such an embodiment is shown in FIG. 2. One feature of this embodiment is the presence of an oppositely doped (p-doping in this case) halo region 165 forming a p-n junction with the ohmic region. In some embodiments, the halo profile also overlaps the supply gate region over a significant distance (of order between 0.1 um to 10 um), and its potential can be tuned independently by a separate heavily-doped p+ region 185 (which may be referred to as a "third doped region") which can be independently biased. These doping profiles can all be realized using standard processing techniques such as ion implantation. The requirements are for the average halo (p+) doping to be opposite to, and lower than, that of the ohmic (n+) region, so that the resistivity of the ohmic region is not increased by dopant compensation. The halo doping concentration may also exceed the metal-insulator transition (MIT) doping concentration above which the region is conducting even at cryogenic temperature (i.e., the doping concentration may be sufficiently great to avoid freeze-out of carriers at a temperature of 5 K and below); for instance, in boron-doped silicon this may correspond to a doping above $4 \times 10^{18}$ cm$^{-3}$. In the embodiment of FIG. 2, the halo region 165 is (i) offset (in the sense that there is a gap from the halo region to the quantum well underneath the supply gate, as shown in FIGS. 2 and 3) so that it is located beneath the quantum well so it does not deplete the latter and is (ii) centered deeper than the ohmic region and extends underneath part or all of the supply gate region. The depth and doping of the halo region 165 may be chosen such that it is not fully depleted under zero bias (i.e., when a bias of 0 V is applied). For instance, in some designs the ohmic doping profile extends roughly 170 nm under the surface and has a peak n-type doping of about $10^{20}$ cm$^{-3}$. In such cases a p-type halo that is centered about 200 nm under the surface with a peak doping of about $10^{19}$ cm$^{-3}$ and a vertical full width half max of about 100 nm may be used.

The band bending induced by the halo doping under the supply gate region determines the vertical field and hence the conduction band diagram of the cap. In particular, the halo can be forward biased such that the MOS supply gate interface potential is near flat band, preventing MOS accumulation. Although forward-biasing a p-n junction might be expected to induce current flow between the ohmic and halo contacts, this may be exponentially suppressed and may be negligible at the cryogenic temperatures of operation for the device, when the turn-on bias for current is essentially equal to or greater than the built-in voltage of the p-n junction.

In operating protocols where a positive vertical field is desired (i.e., pushing electrons in the quantum well 105 against the top interface), a negative bias is expected on the back gate 125 relative to the ohmic ground. Under these conditions, conduction electron leakage occurs by electrons flowing from the back gate 125 towards the quantum well or ohmic regions. This leakage is controlled by the field and electron barrier in the vicinity of the back gate 125 and hence can be blocked by an appropriate barrier design, for example using an SOI substrate or a buried quantum well 130 for the back gate 125. In the embodiment depicted in FIG. 3, the back gate is formed by a heavily n-doped substrate layer which spills carriers over to a quantum well (or "back gate quantum well") 130 directly above it. In some embodiments the ohmic/supply design can be used for alternative back gate designs as well; for example a back gate may be formed without a buried quantum well 130, for instance using a heavily doped standard or SOI substrate. Such a design may be otherwise similar to those of FIGS. 2 and 3 (e.g., having a halo region 165). The presence of a p-halo region also allows another leakage possibility, where holes flow from the halo to the back gate 125 at sufficient forward bias. This leakage is blocked by the built-in barrier at the interface between the halo and lightly doped buffer. In principle, this barrier may be significant at cryogenic operating temperatures, e.g., leakage may be suppressed at fields up to 10 mV/nm to 20 mV/nm; however, in practice, reproducible control of this barrier may depend on details of the doping profile and interface quality.

Therefore, in some embodiments, a design that systematically blocks this hole leakage path may be employed, as depicted in FIG. 3. As in the embodiment of FIG. 2, a p-type halo region is placed (i) underneath the quantum well 105 and (ii) extending beneath the supply and ohmic regions. An additional buried n-type doping region 170 (or "buried n-well" or "buried n-well region", which may be referred to as a "fourth doped region") is formed beneath the p-halo; this can be implemented via ion implantation using the same mask for both regions, but with a higher implant energy for the buried n-well to drive it deeper. In this case the ohmic and buried n-well regions directly contact each other, sharing the same bias and Fermi level, and the ohmic n-doping level is higher than the p-halo doping in the overlap region. Electrical contact to the halo underneath the supply gate can be maintained by the perimeter of the halo region 165, which extends beyond the extents of the ohmic region.

Figure 4A:
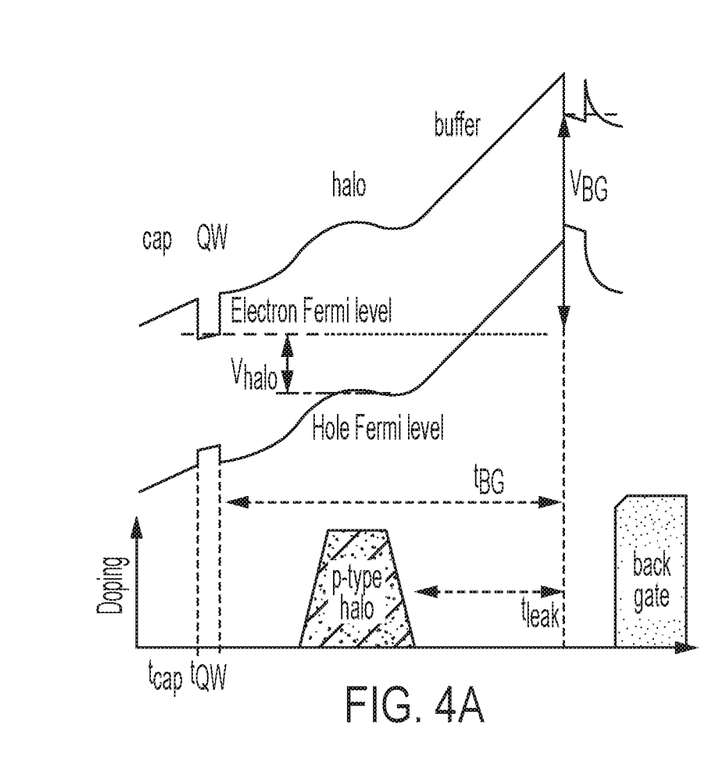
FIG. 4A is a band diagram and schematic doping profile corresponding to the embodiment of FIG. 2.
Figure 4B:
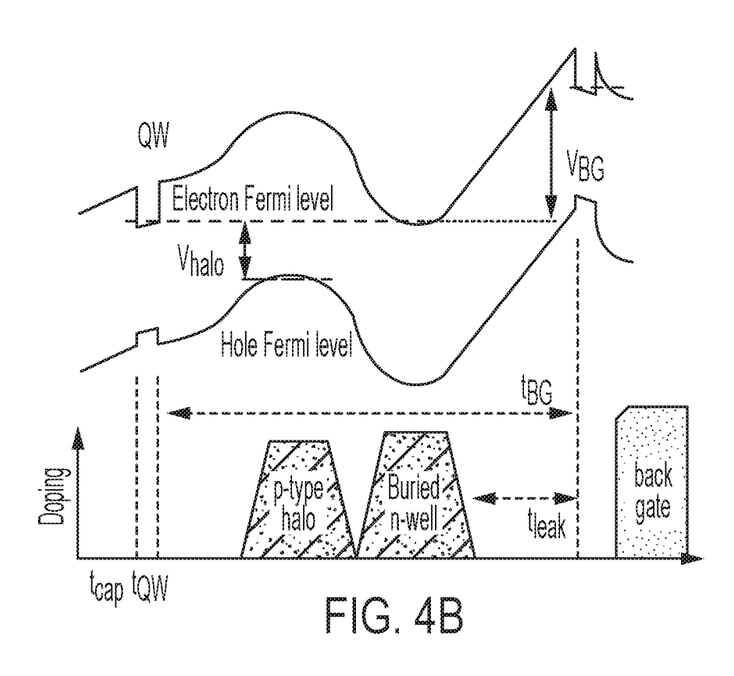
FIG. 4B is a band diagram and schematic doping profile corresponding to the embodiment of FIG. 3.

By maintaining a bias-tunable p-halo region underneath the supply gate, this embodiment preserves the independent field and density control therein. Meanwhile, the presence of the buried n-well region 170 forms a p-n barrier between the halo and the buried buffer, eliminating the possibility of hole leakage into the substrate. This is indicated in FIGS. 4A and 4B, which depict schematic band diagrams of conduction and valence band extrema extending from the cap underneath the supply gate to the back gate (pictured in this case as a remotely doped quantum well). The presence of a forward-biased halo and a negatively-biased back gate leads to a substantial field across the buffer which can drive hole current if the hole Fermi level (in FIG. 4) approaches or crosses the valence band edge in the halo region. The presence of the buried n-well in FIG. 4B blocks this leakage pathway.

FIG. 4A is a schematic band diagram for an embodiment with biased p-halo only underneath the supply region. This drawing shows the presence of a hole leakage path from the halo to the back gate, which is blocked by the depletion region at the halo/buffer interface of the halo/buffer interface. FIG. 4B is a schematic band diagram for an embodiment with a biased p-halo and a buried n-well underneath the supply region. The presence of the n-well supplies an additional hole barrier which eliminates any hole leakage path to the substrate. A corresponding schematic doping profile is pictured below each of the band diagrams of FIGS. 4A and 4B.

The expected maximum achievable vertical fields under the bath and active regions of the device may be directly estimated from considerations of 1-D electrostatics. For example, the estimation may proceed as follows, for the case of lightly or undoped buffers such that the depletion region and band bending associated with the doping can be neglected. Empirically, in quantum well heterostructures of the kind disclosed herein, it is known that tunneling from the well to the cap layer starts to occur past some critical field $F_{tunn}$. In $Si_{0.7}Ge_{0.3}$—Si devices this field appears to be around 10 mV/nm. The maximal achievable field from the back gate is approximately $$F_{BG,max} + \frac{qn_{bath}}{\epsilon} < F_{tunn},$$

where q is the charge of the electron, $n_{bath}$ is the electron density in the region of the quantum well 105 underneath the bath gate 160, E is the dielectric constant of the buffer layer 135 and the cap layer 140, and the bath electron density $n_{bath}$ is controlled by gating (i.e., the electron density $n_{bath}$ in the region of the quantum well 105 underneath the bath gate 160 can be controlled by applying a suitable voltage (known as gating) to the bath gate 160). The buffer layer 135 and the cap layer 140 may consist of the same material, and, in a non-limiting embodiment, may be a SiGe alloy; for example, $Si_{0.7}Ge_{0.3}$. The dielectric constant of the quantum well 145 may be assumed to be roughly equal to that of the cap layer 140 and the buffer layer 135 (it may consist of a similar material; for example, Si). The device quantum well 105 may be much thinner than the cap and buffer, and, as a result, it may not affect the effective dielectric constant much. For typical bath densities of order $3 \times 10^{11}$ cm$^{-2}$ to $4 \times 10^{11}$ cm$^{-2}$, this sets a limit for the maximum vertical field induced by the bath gate to be approximately 6 mV/nm.

Figure 5A:
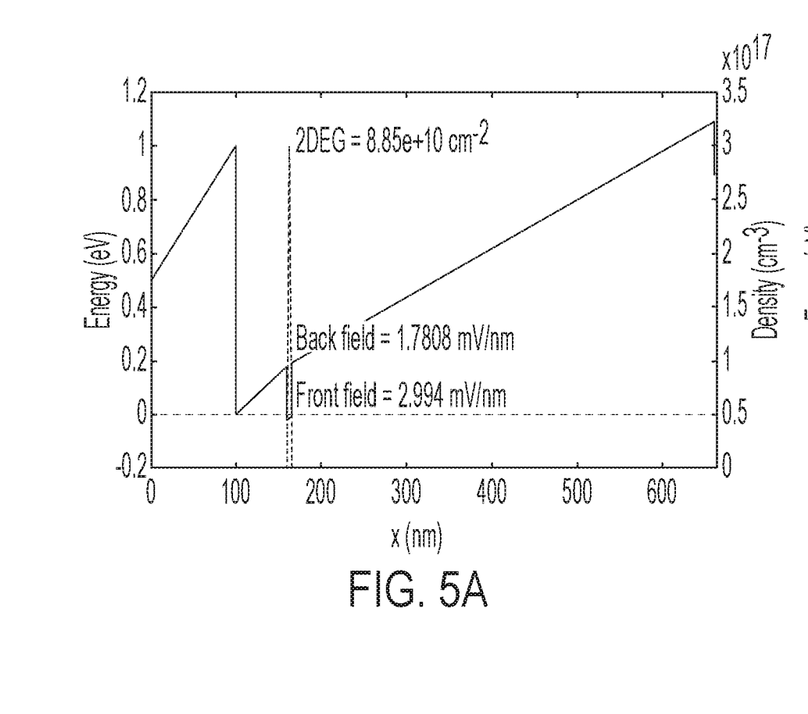
FIG. 5A is a graph of results of a numerical calculation of a conduction band profile and electron density.
Figure 5B:
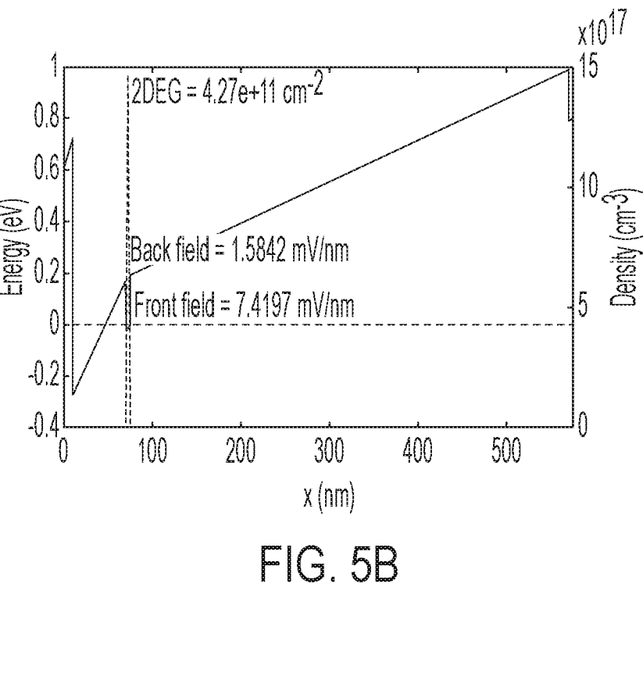
FIG. 5B is a graph of results of a numerical calculation of a conduction band profile and electron density.

This estimate assumes that supply gate accumulation is not an issue due to the biased halo design. If such a design is not used, the limit on maximum back gate field is imposed by lack of MOS accumulation under the supply gate, which can be approximated as the condition that the potential drop over the cap layer 140 is smaller than the conduction band offset of the quantum well $\Delta_{CB}$. As an example, for $\Delta_{CB}$=0.2 eV and a cap thickness $t_{cap}$ of 60 nm, this requires $$F_{BG,max} + \frac{qn_{supply}}{\epsilon} < \frac{\Delta_{CB}}{t_{cap}}$$

where $n_{supply}$ is the electron density in the region of the quantum well 105 underneath the supply gate 120, which can be controlled by applying a suitable voltage (known as gating) to the supply gate 120. For typical supply gate densities of $10^{11}$ cm$^{-2}$, this would set an upper bound on the achievable vertical field of 2 mV/nm, or 3× lower than the bound determined by the bath. By decoupling the vertical field in the supply region from that of the bath, the halo design circumvents this limitation. These calculations are in agreement with numerical 1-D simulations accounting for the quantization of electrons in the quantum well, as illustrated in FIGS. 5A and 5B. The exact bounds can be further tuned via the detailed design of the heterostructure composition and thickness. FIGS. 5A and 5B show the results of numerical calculations of the conduction band profile and electron density with an applied back gate field under biasing conditions for (FIG. 5A) supply gate and (FIG. 5B) bath gate regions. The electron density reaches $8.85 \times 10^{10}$ cm$^{-2}$ for the supply gate scenario at the onset of surface accumulation with a back gate supplied field of 1.78 mV/nm, observable by the intersection of the conduction band edge at the MOS interface (at 100 nm on the x-axis) with the electron Fermi energy depicted by the dotted line. For the bath biasing scenario the back gate field reaches 6 mV/nm when the field in the cap layer 140 is about 11.4 mV/nm.

In the embodiments depicted in FIGS. 2 and 3, the back gate is realized using a buried heavily n-doped layer of SiGe with a strained silicon quantum well (the back gate quantum well 130) directly above it (and separated from it by an intervening layer 127, which may be composed of the same material as the buffer layer 135). The quantum well 130 is remotely doped by spillover of carriers from the doped region beneath, while the conduction band offset provides an additional barrier to prevent leakage from the back gate to the surface. The halo design described herein may also be applied to different realizations of the back gate, for instance using a doped and/or silicon-on-insulator (SOI) substrate. Use of a heavily doped substrate may require prevention of dopant diffusion during the high temperature buffer growth, which may be effected with an SaI substrate for example. The oxide interface may be of sufficient quality to avoid pinning the Fermi level. In such cases the distance of the back gate plane from the device (active) quantum well 105 is sufficiently large (separated by a several-um thick buffer) not to impose a fundamental limitation, though control of the buffer quality may be important. Alternatively, if the back gate is realized using a buried quantum well, there are some relevant limitations on the minimum distance $t_{BG}$ between the active (device) and back gate wells. The presence of the halo and possibly of a buried n-well underneath the ohmic and supply gate areas reduces the distance of lightly doped buffer region to the back gate, depicted as teak in FIGS. 2 and 3. For example, in FIG. 3, $t_{leak} = t_{BG} - (t_{halo} + t_{n\text{-}well})$. The halo region 165 may have a dopant concentration that varies with depth in the sample. A maximum concentration may occur near the middle of the region, and a minimum concentration may occur around the periphery of the region. The periphery depicted in FIGS. 2 and 3 indicates the location at which the concentration in the halo equals the background concentration of unintentional dopants in the buffer layer 135. The thickness $t_{halo}$ may be defined to be the maximum extent, in the vertical direction, of the halo region 165. To prevent back gate leakage, the vertical electric field underneath these areas must not exceed $F_{tunn}$, i.e., $$\frac{V_{BG}}{t_{leak}} < F_{tunn}.$$

The field under the active region, which is the relevant device quantity, depends on the top gates as well, but the contribution of the back gate can be approximated as $$F_{active} = \frac{V_{BG}}{t_{BG} + t_{QW} + t_{cap} + t_{ox}}$$

where the denominator is the total distance between the back and top gates. The maximum achievable active field is therefore given by $$F_{active,max} \leq \frac{F_{tunn} t_{leak}}{t_{BG} + t_{QW} + t_{cap} + t_{ox}},$$

where $t_{ox}$ is the thickness of the layer 157 of dielectric material (which is part of the top layer 145) under the dot gates 155. Using these simple rules, estimates may be obtained for possible design parameters. In some heterostructure designs, the distance from the top gates to the bottom of the active quantum well $t_{QW}+t_{cap}+t_{ox}$ is about 70 nm. In order to prevent overlap of the p-type dopants with the quantum well, the halo implant may be placed 100 nm underneath the active quantum well (e.g., the peak doping concentration of the halo implant 160, in the vertical direction, may be located 100 nm underneath the quantum well 105), with a peak p-type doping concentration of about $10^{19}$ cm$^{-3}$ so as to be above the MIT but not completely compensating the doping in the ohmic region. A halo layer thickness $t_{halo}$ of about 30 nm should ensure that it will not be fully depleted, as the depletion width of such a layer is about 13 nm. The buried n-well can be implemented as another 30 nm layer of $10^{19}$ n-type doping, so that the total extent of the halo and buried n-well below the active well is about 160 nm. For a buried back gate located $t_{BG}$=500 nm underneath the active well, $t_{leak}$=340 nm and $F_{active,max}$ reaches 6 mV/nm, close to the expected maximum due to bath gate limitations. These estimates assume simple abrupt doping profiles and may be quantitatively modified in the presence of the nonuniform straggle and diffusion of actual implanted and annealed doping profiles.

The presence of a back gate allows for a well-defined ground plane underneath the active region. In addition to modifying the vertical field, changing the bias of this gate also shifts the threshold voltage of the entire device. This can be practically advantageous for altering the range of operating voltages within which device operation takes place. In the case of an undoped buffer, the threshold voltage shift (relative to the top gates) in a 1-D model can be simply approximated as $$\Delta V_{th} = -\frac{V_{BG} t_{cap}}{t_{BG}}$$

In the case where reducing the threshold voltage is desired, this implies that the back gate should be forward biased, in contrast to the cases discussed previously. This tends to reduce the vertical field but changes the direction of possible leakage flow, such that electrons tend to flow towards the substrate. Therefore a single halo may be sufficient to block leakage flow from the ohmics and supply region, such as in the embodiment shown in FIG. 2; owing to the larger barrier in this scenario, the primary leakage path would potentially be tunneling from the device quantum well 105 to the substrate. The maximum induced field between the QW and the back gate is approximately $$\frac{V_{BG}}{t_{BG}} \leq -F_{tunn}.$$

This suggests that the back gate depth affects the leakage onset and the achievable threshold voltage shift in the same way, e.g., $\Delta V_{th,max} \leq F_{tunn} t_{cap}$, since the cap thickness may be fixed by other considerations. As an example, for a nominal cap thickness of 60 nm and $F_{max}$=10 mV/nm, this sets a probable bound on $\Delta V_{th,max} \leq -0.6$ V. The primary limitation on the back gate distance $t_{BG}$ may then be set by either other processing constraints, such as the need to keep the dopants used for substrate doping sufficiently far from the QW, or applied voltage constraints on the back gate bias, since $$V_{BG,max} = \frac{\Delta V_{th,max}}{t_{cap}} t_{BG}$$

and therefore scales with $t_{BG}$.

As used herein, any structure or layer that is described as being "made of" or "composed of" a substance should be understood (i) in some embodiments, to contain that substance as the primary component or (ii) in some embodiments, to contain that substance as the major component. As used herein, a "conductivity type" of a semiconductor material may be n-type, or p-type (depending, for example, on doping).

As used herein, "a portion of" something means at least some of the thing, and as such may mean less than all of, or all of, the thing. As such, "a portion of" a thing includes the entire thing as a special case, i.e., the entire thing is an example of a portion of the thing.

As used herein, when a second number is "within Y %" of a first number, it means that the second number is at least (1−Y/100) times the first number and the second number is at most (1+Y/100) times the first number. As used herein, the word "or" is inclusive, so that, for example, "A or B" means any one of (i) A, (ii) B, and (iii) A and B.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" refers to a component that is present in a composition, polymer, or product in an amount greater than an amount of any other single component in the composition or product. In contrast, the term "primary component" refers to a component that makes up at least 50% by weight or more of the composition, polymer, or product. As used herein, the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a back-gated quantum well heterostructure have been specifically described and illustrated herein, many modifications and variations will be apparent to those skilled in the art. Accordingly, it is to be understood that a back-gated quantum well heterostructure constructed according to principles of this disclosure may be embodied other than as specifically described herein. The invention is also defined in the following claims, and equivalents thereof.

What is claimed is:

1. A semiconductor device, comprising:
    a back gate layer;
    a buffer layer, on the back gate layer;
    a device quantum well layer, on the buffer layer;
    a cap layer, on the device quantum well layer;
    a top layer, on the cap layer;
    a first doped region of a first conductivity type, extending at least part-way through the device quantum well layer;
    a second doped region, of a second conductivity type, within the buffer layer; and
    a third doped region, of the second conductivity type extending from the top layer to the second doped region,
    the top layer comprising:
        a dielectric layer, and, in the dielectric layer, a plurality of conductive elements, including:
        one or more dot gates;
        an ohmic contact;
        a bath gate, between the one or more dot gates and the ohmic contact;
        a supply gate between the bath gate and the ohmic contact; and
        a halo contact,
    the third doped region extending from the halo contact to the second doped region,
    the second doped region extending under the ohmic contact and under the supply gate.

2. The semiconductor device of claim 1, wherein the cap layer is undoped under the supply gate, under the bath gate, and under the one or more dot gates.

3. The semiconductor device of claim 1, wherein the buffer layer is undoped under the bath gate and under the one or more dot gates.

4. The semiconductor device of claim 1, wherein the second doped region has a dopant concentration sufficiently great to avoid freeze-out of carriers at temperatures less than 5 K.

5. The semiconductor device of claim 1, wherein the second doped region has a peak dopant concentration of at least $10^{18}/cm^3$.

6. The semiconductor device of claim 1, wherein the second doped region has a vertical full width half maximum of at least 30 nm.

7. The semiconductor device of claim 1, wherein the first doped region has a peak dopant concentration of at least $10^{19}/cm^3$.

8. The semiconductor device of claim 1, wherein the third doped region has a peak dopant concentration of at least $10^{19}/cm^3$.

9. The semiconductor device of claim 1, wherein the first conductivity type is n-type and the second conductivity type is p-type.

10. The semiconductor device of claim 1, further comprising a back gate quantum well, on the back gate layer.

11. The semiconductor device of claim 1, further comprising a fourth doped region of the first conductivity type within the buffer layer,
the fourth doped region being under the second doped region and having at least the same lateral extent as the second doped region.

12. The semiconductor device of claim 11 wherein the first doped region extends to the fourth doped region.

13. The semiconductor device of claim 11 wherein the fourth doped region has a dopant concentration sufficiently great to avoid freeze-out of carriers at temperatures less than 5 K.

14. The semiconductor device of claim 11, wherein the cap layer is undoped under the supply gate, under the bath gate, and under the one or more dot gates.

15. The semiconductor device of claim 11, wherein the buffer layer is undoped under the bath gate and under the one or more dot gates.

16. The semiconductor device of claim 11, wherein the second doped region has a dopant concentration sufficiently great to avoid freeze-out of carriers at temperatures less than 5 K.

17. The semiconductor device of claim 11, wherein the second doped region has a peak dopant concentration of at least $10^{18}/cm^3$.

18. The semiconductor device of claim 11, wherein the second doped region has a vertical full width half maximum of at least 30 nm.

19. The semiconductor device of claim 11, wherein the first doped region has a peak dopant concentration of at least $10^{19}/cm^3$.

20. The semiconductor device of claim 11, wherein the third doped region has a peak dopant concentration of at least $10^{19}/cm^3$.

* * * * *